US012813260B2

(12) United States Patent
Hu et al.

(10) Patent No.: US 12,813,260 B2
(45) Date of Patent: Nov. 24, 2026

(54) SEMICONDUCTOR DEVICE AND A METHOD FOR FABRICATING THE SAME

(71) Applicant: Taiwan Semiconductor Manufacturing Company, Ltd., Hsinchu (TW)

(72) Inventors: Chia-Hsin Hu, Changhua County (TW); Yu-Chiun Lin, Taipei City (TW); Yi-Hsuan Chung, Kaohsiung City (TW); Chung-Peng Hsieh, New Taipei City (TW); Chung-Chieh Yang, Zhubei City (TW); Po-Nien Chen, Miaoli City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 339 days.

(21) Appl. No.: 18/735,037

(22) Filed: Jun. 5, 2024

(65) Prior Publication Data

US 2024/0321731 A1 Sep. 26, 2024

Related U.S. Application Data

(63) Continuation of application No. 17/099,002, filed on Nov. 16, 2020, now Pat. No. 12,033,937, which is a (Continued)

(51) Int. Cl.

*H10W 20/40* (2026.01)
*H10B 43/27* (2023.01)

(Continued)

(52) U.S. Cl.

CPC .......... *H10W 20/498* (2026.01); *H10B 43/27* (2023.02); *H10D 1/00* (2025.01); *H10D 1/474* (2025.01)

(58) Field of Classification Search

CPC .......... H10B 43/27; H10D 1/00; H10D 1/474; H10D 30/024; H10D 30/0243;

(Continued)

(56) References Cited

U.S. PATENT DOCUMENTS 6,479,385 B1 11/2002 Jang et al.
6,728,130 B1 4/2004 Afghahi et al.

(Continued)

FOREIGN PATENT DOCUMENTS

TW 201338117 A 9/2013

OTHER PUBLICATIONS

Notice of Allowance issued in U.S. Appl. No. 16/229,945, dated Jul. 10, 2020.

(Continued)

*Primary Examiner* — Britt Hanley
*Assistant Examiner* — Kevin Quinto
(74) *Attorney, Agent, or Firm* — STUDEBAKER BRACKETT PLLC

(57) ABSTRACT

A semiconductor device includes a dummy fin structure disposed over a substrate, a dummy gate structure disposed over a part of the dummy fin structure, a first interlayer dielectric layer in which the dummy gate structure is embedded, a second interlayer dielectric layer disposed over the first interlayer dielectric layer, and a resistor wire formed of a conductive material and embedded in the second interlayer dielectric layer. The resistor wire overlaps the dummy gate structure in plan view.

20 Claims, 15 Drawing Sheets

Related U.S. Application Data continuation of application No. 16/229,945, filed on Dec. 21, 2018, now Pat. No. 10,840,181, which is a continuation of application No. 15/693,083, filed on Aug. 31, 2017, now Pat. No. 10,170,414, which is a continuation of application No. 15/009,500, filed on Jan. 28, 2016, now Pat. No. 9,773,731.

(51) Int. Cl.
*H10D 1/00* (2025.01)
*H10D 1/47* (2025.01)

(58) Field of Classification Search
CPC ............ H10D 30/6219; H10D 64/017; H10D 64/666; H10D 64/671; H10D 89/10; H10W 20/01; H10W 20/498
See application file for complete search history.

(56) References Cited

U.S. PATENT DOCUMENTS

| | | | | |
|---|---|---|---|---|
| 2006/0194436 | A1 | 8/2006 | Oh et al. | |
| 2006/0273409 | A1* | 12/2006 | Lee .................... | H10D 30/0277 257/407 |
| 2009/0051008 | A1 | 2/2009 | Shin et al. | |
| 2013/0234292 | A1 | 9/2013 | Wei et al. | |
| 2015/0236134 | A1 | 8/2015 | Zhong et al. | |
| 2016/0020148 | A1 | 1/2016 | Song et al. | |
| 2016/0064373 | A1 | 3/2016 | Narita | |
| 2016/0204100 | A1 | 7/2016 | Zhang et al. | |

OTHER PUBLICATIONS

Non-Final Office Action issued in U.S. Appl. No. 16/229,945, dated Jan. 2, 2020.
Non-Final Office Action issued in U.S. Appl. No. 16/229,945, dated Jun. 21, 2019.
Office Action issued in corresponding Korean Patent Application No. 10-2016-0137501, mailed Oct. 23, 2017.
Office Action issued in corresponding Taiwanese Application No. 105125713, dated Jan. 22, 2018.
Non-Final Office Action issued in U.S. Appl. No. 15/009,500, mailed Sep. 27, 2018.
Non-Final Office Action issued in U.S. Appl. No. 15/693,083, dated Mar. 30, 2018.
Non-Final Office Action issued in U.S. Appl. No. 17/099,002, dated Feb. 8, 2023.
Final Office Action issued in U.S. Appl. No. 17/099,002, dated Aug. 17, 2023.
Notice of Allowance issued in U.S. Appl. No. 17/099,002, dated Mar. 5, 2024.

* cited by examiner

SEMICONDUCTOR DEVICE AND A METHOD FOR FABRICATING THE SAME

CROSS REFERENCE TO RELATED APPLICATIONS

This application is a continuation of U.S. patent application Ser. No. 17/099,002 filed on Nov. 16, 2020, which is a continuation of U.S. patent application Ser. No. 16/229,945 filed on Dec. 21, 2018, now U.S. Pat. No. 10,840,181, which is a continuation of U.S. patent application Ser. No. 15/693,083 filed on Aug. 31, 2017, now U.S. Pat. No. 10,170,414, which is a continuation of U.S. patent application Ser. No. 15/009,500 filed on Jan. 28, 2016, now U.S. Pat. No. 9,773,731, the entire content of each of which applications is incorporated herein by reference.

TECHNICAL FIELD

The disclosure relates to a method for manufacturing a semiconductor device, and more particularly to a structure and a manufacturing method for a resistor wire over underlying structures.

BACKGROUND

In a semiconductor device, such as an integrated circuit (IC) or a large scale integration (LSI), a lot of resistors are used. Some of the resistors are formed by diffusion regions forming in a substrate and some of the resistors are formed by conductive layers formed in upper layers above the underlying structures. With a decrease of dimensions of semiconductor devices, a more efficient layout for the resistors has been required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A-9A show various stages of the sequential fabrication process of a semiconductor device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
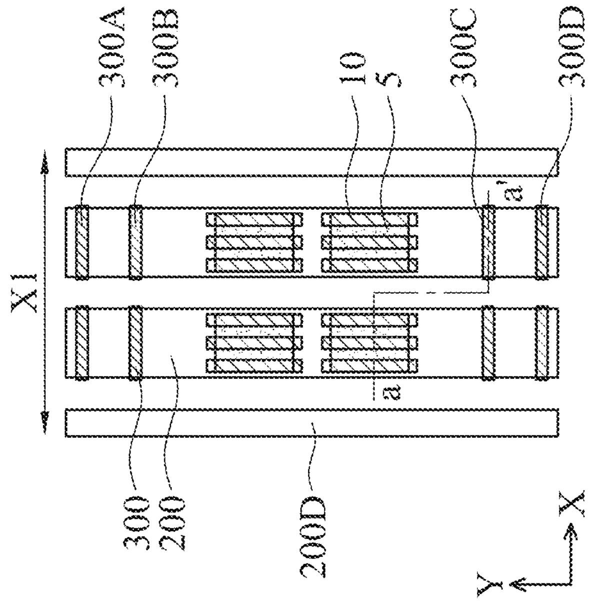
FIG. 1A shows an exemplary plan view (viewed from the above) illustrating a layout structure of a semiconductor device according to one embodiment of the present disclosure.
Figure 1B:
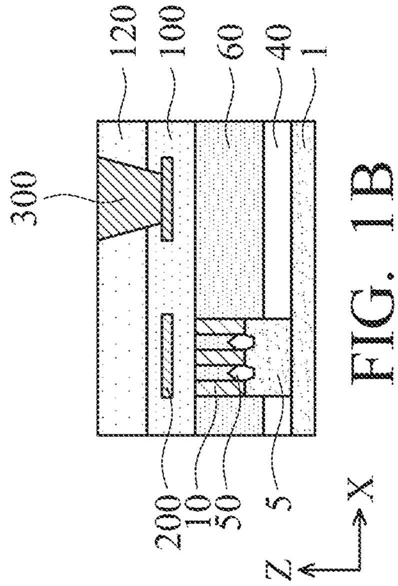
FIG. 1B shows an exemplary cross sectional view along line a-a' of FIG. 1A.

FIG. 1A shows an exemplary plan view (viewed from the above) illustrating a layout structure of a semiconductor device according to one embodiment of the present disclosure. FIG. 1B shows an exemplary cross sectional view along line a-a' of FIG. 1A.

In FIGS. 1A and 1B, a resistor wire 200 extending in the Y direction is provided. The resistor wire 200 is made of a conductive material, such as a metal or a metal nitride. Since the resistor wire 200 is a resistor, the conductivity of the resistor wire 200 is relatively low compared with other wires for transferring signals. The resistivity of the resistor wire 200 is in a range from about 1 Ω/□ to about 1000 Ω/□, in some embodiments. The material for the resistor wire 200 includes, for example, TiN, TaN or TiSiN.

The size and thickness of the resistor wire 200 may vary depending on the purposes or applications of the resistor wire 200.

As shown in FIG. 1A, the resistor wire 200 includes contacts (or vias) 300 for the resistor wire 200 to be connected to another circuit element via upper layer metal wires. In some embodiments, only four contacts 300A, 300B, 300C and 300D are provided on the resistor wire 200. The contacts 300A and 300D are used to provide a current flow therebetween and the contacts 300B and 300C are used to measure a voltage or obtain a voltage drop.

In FIGS. 1A and 1B, two resistor wires 200 arranged in the X direction are shown. Further, dummy wire patterns 200D are disposed at both sides of the resistor wires 200 along the X direction to improve pattern fidelity in patterning operations, such as lithography and etching.

However, the layout of the resistor wire 200 is not limited to these figures. The number of the resistor wires 200 may be as small as one or three or more with (and between) or without two dummy wire patterns.

As shown in FIGS. 1A and 1B, just under the resistor wire 200, a dummy fin structure 5, dummy gate structures 10 and dummy source/drain (S/D) structures 50 are disposed over a substrate 1. As shown in FIG. 1A, the resistor wire 200 overlaps the dummy fin structure 5 and the dummy gate structures 10 in plan view. In other words, the resistor wire 200 is aligned with the dummy fin structure 5 along the Y direction. Each of the dummy gate structures 10 may include a dummy gate dielectric layer and a dummy gate electrode layer. In the present disclosure, a dummy "element" means that the "element" has no electrical function or is not part of a functioning circuit, and "a plan view" means a view along the normal line (the Z direction) of the substrate 1 toward the substrate 1 from above.

In one embodiment, plural dummy gate structures 10 are disposed over a part of the dummy fin structure 5. The plural dummy gate structures 10 extend in the Y direction and the dummy fin structure 5 extends in the X direction. As shown in FIG. 1A, plural fin structures 5 are disposed under one resistor wire 200 and are aligned along the Y direction. The number of the dummy fin structures per resistor wire is not limited two, and the number may be one or three or more.

In one embodiment, plural dummy gate structures 10 (and thus plural dummy gate electrode layers) are disposed over one dummy fin structure 5, as shown in FIGS. 1A and 1B. However, the number of the dummy gate structures may be as small as one per dummy fin structure and more than three per dummy fin structure. As shown in FIG. 1, the resistor wire 200 overlaps all three dummy gate structures in plan view. In some embodiments, the dummy gate structures 10 extend in the Y direction and are disposed over two or more dummy fin structures 5.

In plan view, the dummy fin structure 5 and the dummy gate structures 10 are disposed between a pair of contacts 300A and 300D and a pair of the contacts 300B and 300C, and thus the contacts 300 do not overlap the dummy gate structures 10. In other embodiments, however, at least one of the contacts 300 overlaps the dummy gate structures 10.

As shown in FIG. 1B, the dummy fin structure 5 is disposed over the substrate 1, the dummy gate structures 10 are disposed over a part of the dummy fin structure 5, and an isolation insulating layer 40 is also disposed over the substrate 1. The dummy fin structure 5 is partially embedded in the isolation insulating layer 40. Further, a first interlayer dielectric (ILD) layer 60 is formed over the dummy fin structure 5. The dummy gate structures 10 are embedded in the first ILD layer 60. A second ILD layer 100 is further disposed over the first ILD layer 60. The resistor wire 200 is embedded in the second ILD layer 100. A third ILD layer 120 is further disposed over the second ILD layer 100. The contact 300 is formed in the second and third ILD layers. In some embodiments, the contact 300 is formed in the second ILD layer 100 only.

Figure 2A:
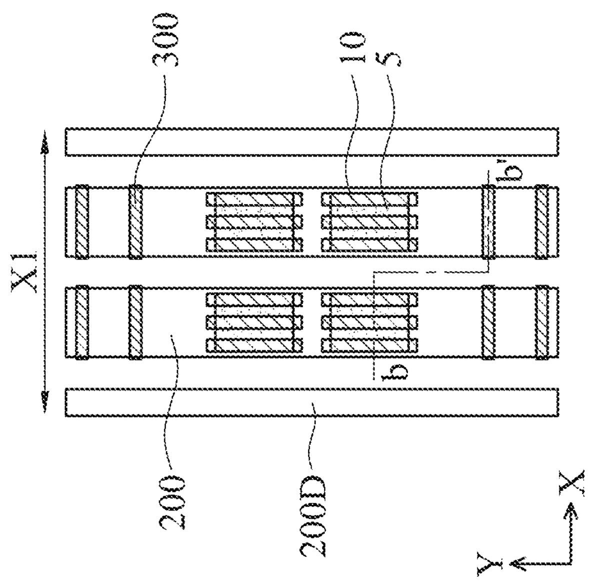
FIG. 2A shows an exemplary plan view illustrating a layout structure of a semiconductor device according to one embodiment of the present disclosure.
Figure 2B:
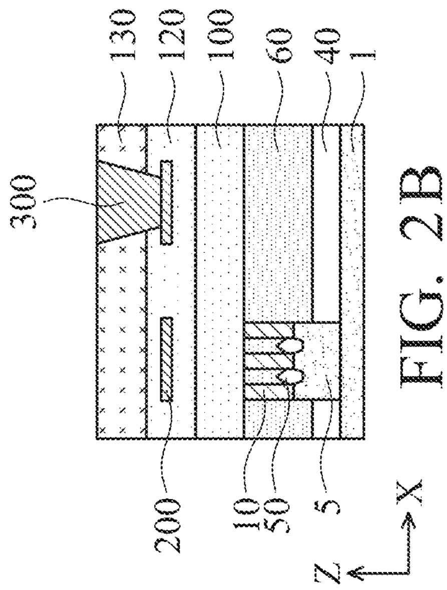
FIG. 2B shows an exemplary cross sectional view along line b-b' of FIG. 2A.

FIG. 2A shows an exemplary plan view illustrating a layout structure of a semiconductor device according to one embodiment of the present disclosure. FIG. 2B shows an exemplary cross sectional view along line b-b' of FIG. 2A.

The layout and the structures of FIGS. 2A and 2B are substantially the same as those of FIGS. 1A and 1B, except for the location of the resistor wire 200 along the Z direction. As shown in FIG. 2B, the dummy fin structure 5 is disposed over the substrate 1, the dummy gate structures 10 are disposed over a part of the dummy fin structure 5, and an isolation insulating layer 40 is also disposed over the substrate 1. The dummy fin structure 5 is partially embedded in the isolation insulating layer 40. Further, a first interlayer dielectric (ILD) layer 60 is formed over the dummy fin structure 5. The dummy gate structures 10 are embedded in the first ILD layer 60. A second ILD layer 100 is further disposed over the first ILD layer 60. A third ILD layer 120 is further disposed over the second ILD layer 100. The resistor wire 200 is embedded in the third ILD layer 120, not in the second ILD layer 100. A fourth ILD layer 130 is further disposed over the third ILD layer 120. The contact 300 is formed in the third and fourth ILD layers. In some embodiments, the contact 300 is formed in the third ILD layer 120 only.

Compared with the structure of FIG. 1B, an additional ILD layer is interposed between the ILD layer in which the resistor wire 200 is disposed and the ILD layer in which the dummy gate structures are disposed, in the structure of FIG. 2B. In other embodiments, more than one additional ILD layers are interposed between the ILD layer in which the resistor wire 200 is disposed and the ILD layer in which the dummy gate structures are disposed.

Figure 3A:
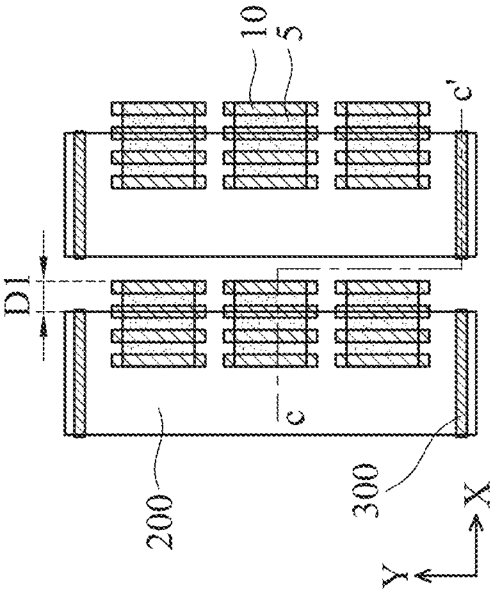
FIG. 3A shows an exemplary plan view illustrating a layout structure of a semiconductor device according to one embodiment of the present disclosure.
Figure 3B:
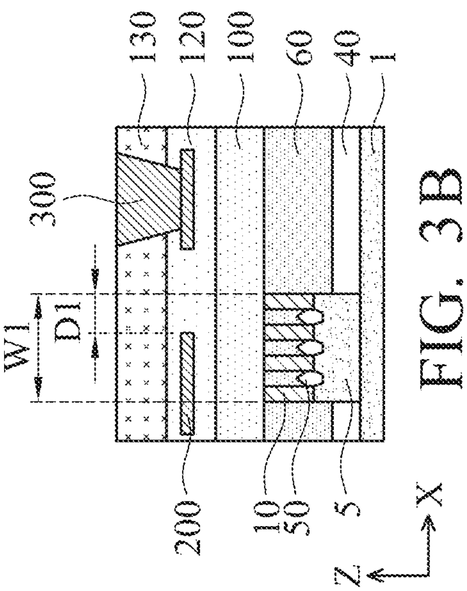
FIG. 3B shows an exemplary cross sectional view along line c-c' of FIG. 3A.

FIG. 3A shows an exemplary plan view illustrating a layout structure of a semiconductor device according to one embodiment of the present disclosure. FIG. 3B shows an exemplary cross sectional view along line c-c' of FIG. 3A.

The layout and the structures of FIGS. 3A and 3B are substantially the same as those of FIGS. 2A and 2B, except for the location of the resistor layer 200 along the X direction and the number of the dummy gate structures.

As shown in FIG. 3A, the resistor wire 200 partially overlaps the dummy fin structure 5 in plan view. In other words, the edge (e.g., right edge) of the resistor wire 200 is shifted with respect to the edge (e.g., right edge) of the dummy fin structure 5 in the X direction. Further, the resistor wire 200 overlaps two of the dummy gate structures disposed over one dummy fin structure, partially overlaps one of the dummy gate structures disposed over the same dummy fin structure and does not overlap one of the dummy gate structures disposed over the same dummy fin structure.

The "shift" amount D1 is $0 \leq D1 \leq 0.5$ W1, where W1 is the width of the dummy fin structure 5 in the X direction. When the amount D1 is zero or minus, the resistor wire 200 fully overlaps the dummy fin structure 5 in plan view.

Figure 4A:
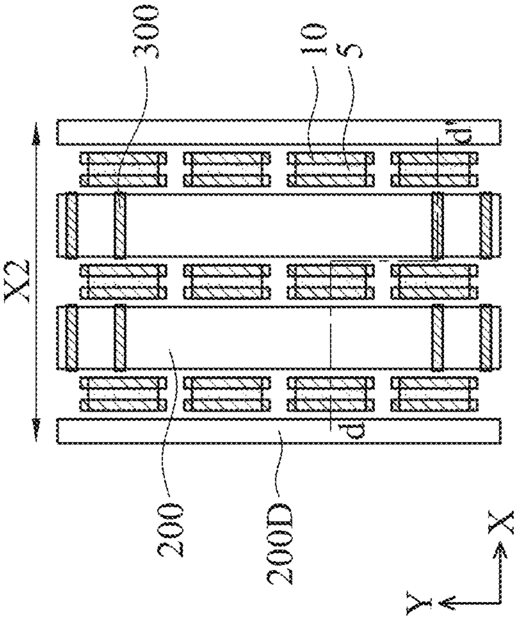
FIG. 4A shows an exemplary plan view illustrating a layout structure of a semiconductor device according to a comparative example.
Figure 4B:
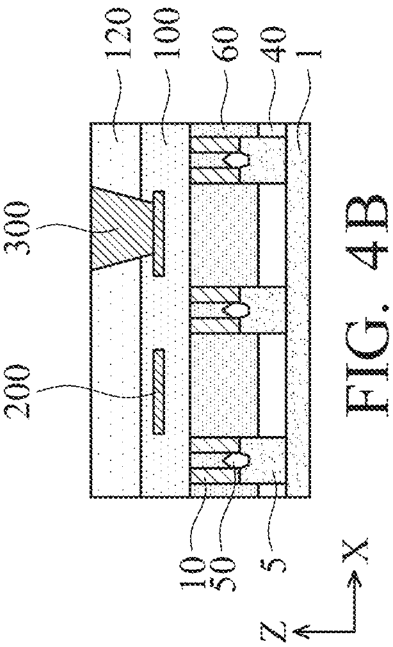
FIG. 4B shows an exemplary cross sectional view along line d-d' of FIG. 4A.

FIG. 4A shows an exemplary plan view illustrating a layout structure of a semiconductor device according to a comparative example. FIG. 4B shows an exemplary cross sectional view along line d-d' of FIG. 4A.

In the comparative example, the resistor wire 200 does not overlap the dummy fin structure 5 and the dummy gate structures in plan view. The resistor wire 200 is disposed in an area between the dummy fin structures in plan view.

Comparing the layout of FIGS. 1A and 2A with that of FIG. 4A, it is clear that the width in the X direction can be reduced. In one embodiment, the width X1 of FIGS. 1A and 2A is about 80%-90% of the width X2 of FIG. 4A.

Figure 5B:
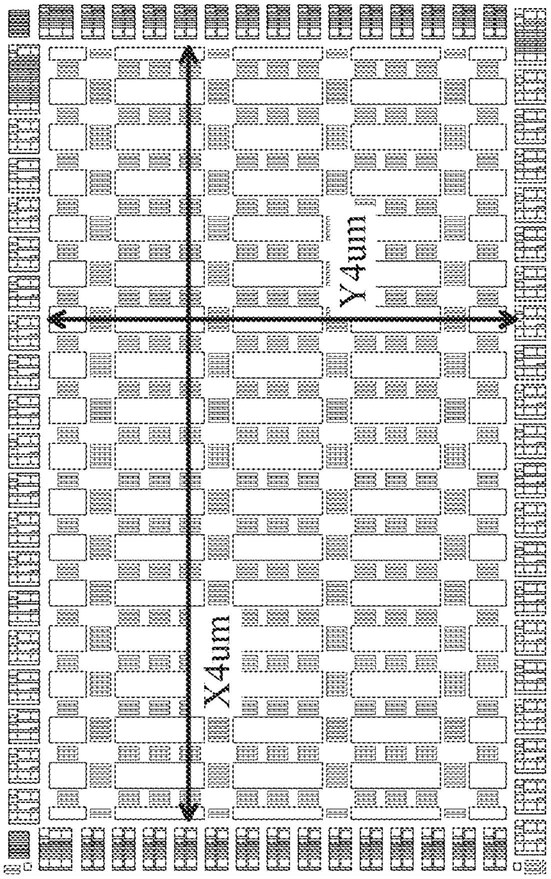
FIG. 5B shows an exemplary plan view illustrating a layout structure of a semiconductor device according to a comparative example.
Figure 5A:
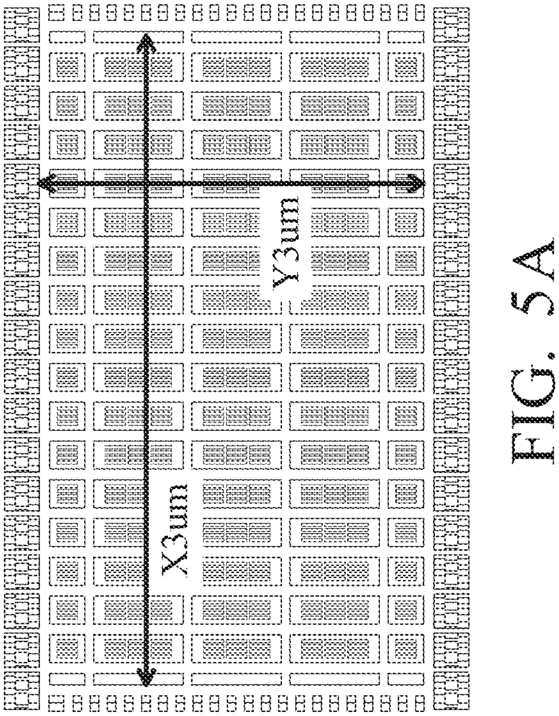
FIG. 5A shows an exemplary plan view illustrating a layout structure of a semiconductor device according to one embodiment of the present disclosure.

Further, as shown in FIG. 5A, in an array of resistor wires, by placing all of the dummy fin structure and the dummy gate structures under the resistor wires (utilizing the layouts of FIG. 1A or 1B), it is possible to reduce the area of the array. In one embodiment, the width X3 of FIG. 5A is about 80%-90% of the width X4 of FIG. 5B, which utilizes the layout of FIG. 4A, and the width Y3 of FIG. 5A is about 80%-90% of the width Y4 of FIG. 5B.

Figure 5C:
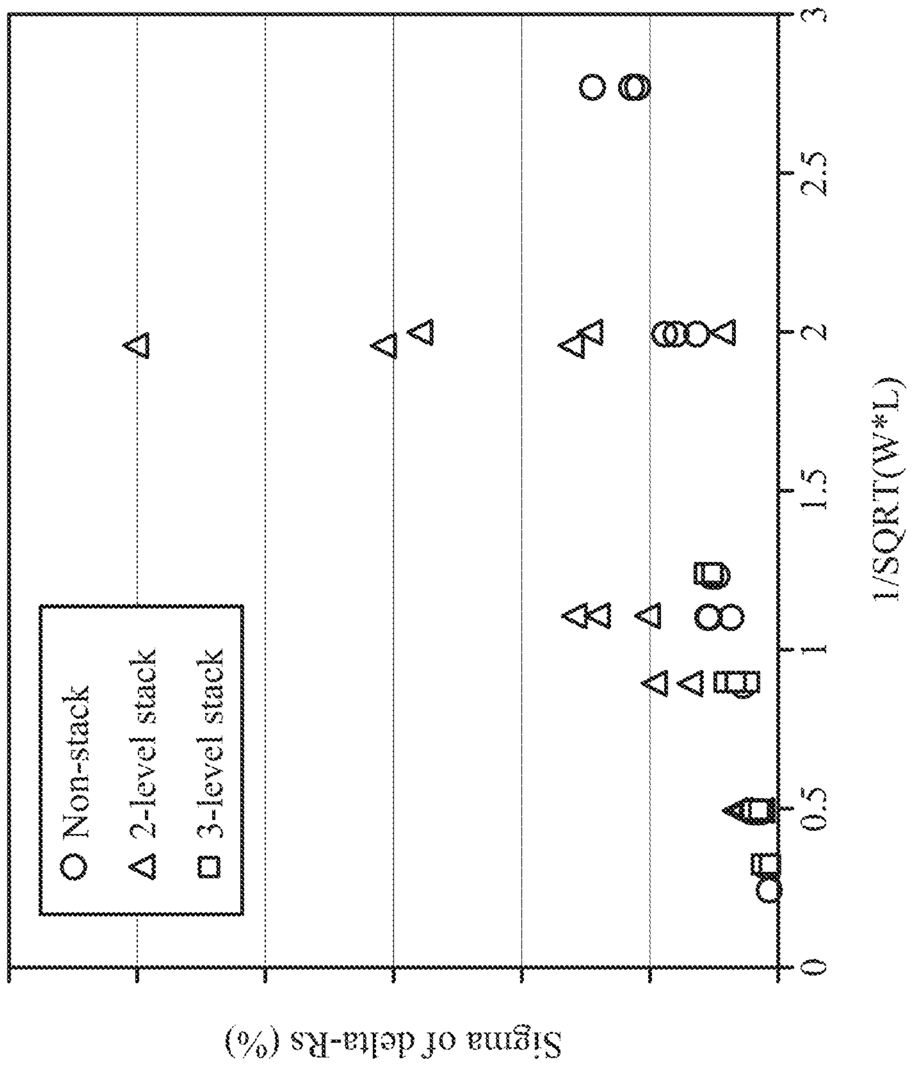
FIG. 5C shows the variation of resistor values according to the size of the resistors.

FIG. 5C shows variation of resistor values according to the size of the resistors. The horizontal axis shows an inverse of the square root of the area of the resistor wire, and the vertical axis shows variation $\sigma$ of resistivity differences.

In FIG. 5C, "non-stack" corresponds to the structure of FIGS. 4A and 4B, "2-level stack" corresponds to the structure of FIGS. 1A and 1B, and "3-level stack" corresponds to the structure of FIGS. 2A and 2B.

When the sizes of the resistor wires are large, the variations of the resistivity are small in all structures. When the sizes become smaller, the variations increase. In particular, the variations for the "2-level stack" increase more than the other two structures. In some embodiments, the average variation for the "2-level stack" is twice or more than those for the "3-level stack." By interposing one or more additional ILD layers between the ILD layer in which the resistor wire 200 is disposed and the ILD layer in which the dummy gate structures are disposed, it is possible to reduce the variations of the resistivity and also to reduce the area of the resistor wire pattern.

FIGS. 6A-9A show various stages of the sequential fabrication process of a semiconductor device according to one embodiment of the present disclosure. It is understood that additional operations can be provided before, during, and after the processes shown by FIGS. 6A-9A, and some of the operations described below can be replaced or eliminated, for additional embodiments of the method. The order of the operations/processes may be interchangeable.

Figure 6A:
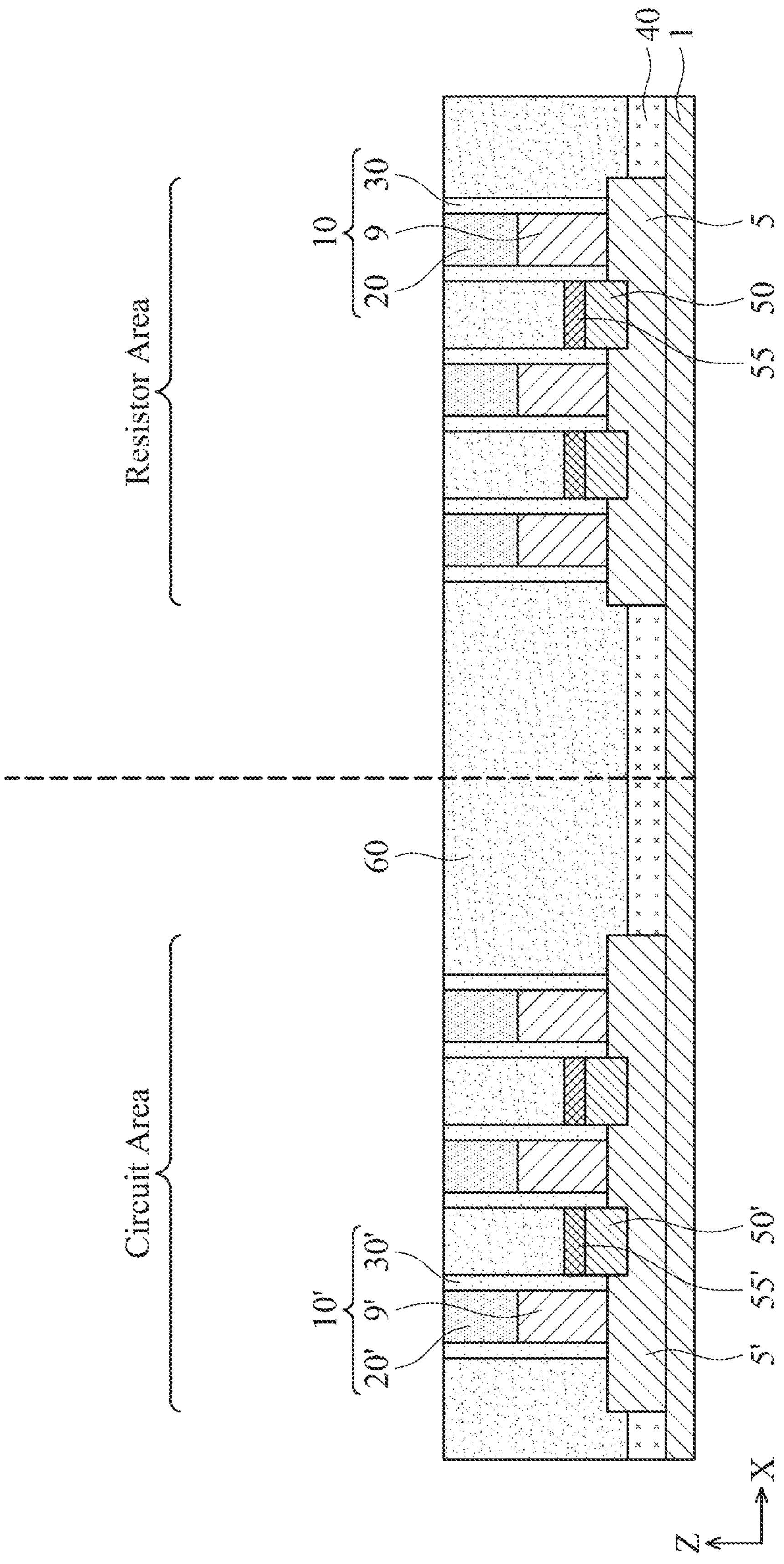

FIG. 6A shows a structure of a semiconductor device after metal gate structures are formed. FIG. 6A shows a circuit area, in which a functioning circuit is disposed, and a resistor area, in which a resistor wire and a dummy fin and gate structure are disposed. In the circuit area of FIG. 6A, metal gate structures 9' are formed over a channel layer, for example, a part of a fin structure 5', and cap insulating layers 20' are disposed over the metal gate structures 9'. The fin structure 5' protrudes from the isolation insulating layer 40. The thickness of the metal gate structures 9' is in a range from 15 nm to 50 nm in some embodiments. The thickness of the cap insulating layer 20' is in a range from about 10 nm to about 30 nm in some embodiments, and is in a range from about 15 nm to about 20 nm in other embodiments. Sidewall spacers 30' are provided on sidewalls of the metal gate structure 9' and the cap insulating layer 20'. The film thickness of the sidewall spacers 30' at the bottom of the sidewall spacers is in a range from about 3 nm to about 15 nm in some embodiments, and is in a range from about 4 nm to about 10 nm in other embodiments. The combination of the metal gate structure 9', the cap insulating layer 20' and sidewall spacers 30' may be collectively referred to as a gate structure 9'. Further, source/drain (S/D) regions 50' are formed adjacent to the gate structures, and spaces between the gate structures are filled with a first interlayer dielectric (ILD) layer 60. In addition, a silicide layer 55', such as WSi, CoSi, NiSi or TiSi, is formed on the S/D regions 50'.

Similarly, in the resistor area, substantially the same structure is formed. The dummy metal gate structures 9 are formed over a dummy channel layer, which is a part of the dummy fin structure 5, and dummy cap insulating layers 20 are disposed over the dummy metal gate structures 9. The dummy fin structure 5 protrudes from the isolation insulating layer 40. Dummy sidewall spacers 30 are provided on sidewalls of the dummy metal gate structure 9 and the dummy cap insulating layer 20. The combination of the dummy metal gate structure 9, the dummy cap insulating layer 20 and dummy sidewall spacers 30 may be collectively referred to as a dummy gate structure 10. Further, dummy source/drain (S/D) regions 50 are formed adjacent to the dummy gate structures 10, and spaces between the gate structures are filled with the first ILD layer 60. In addition, a dummy silicide layer 55 is formed on the dummy S/D regions 50.

Figure 6C:
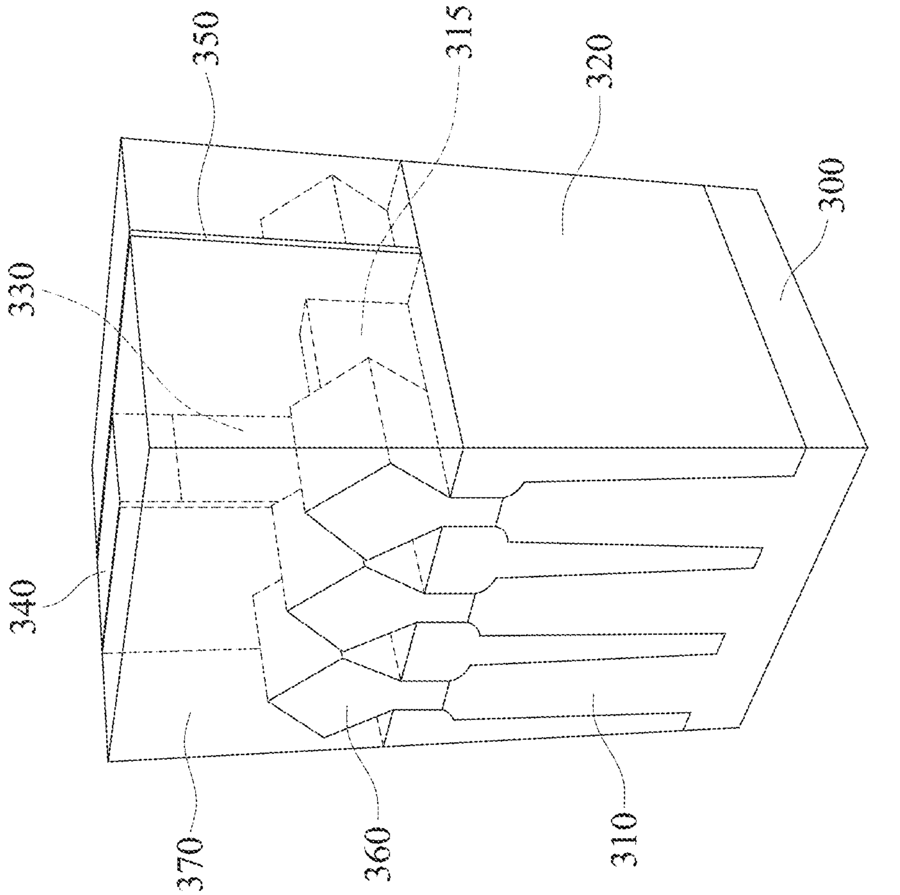
Figure 6B:
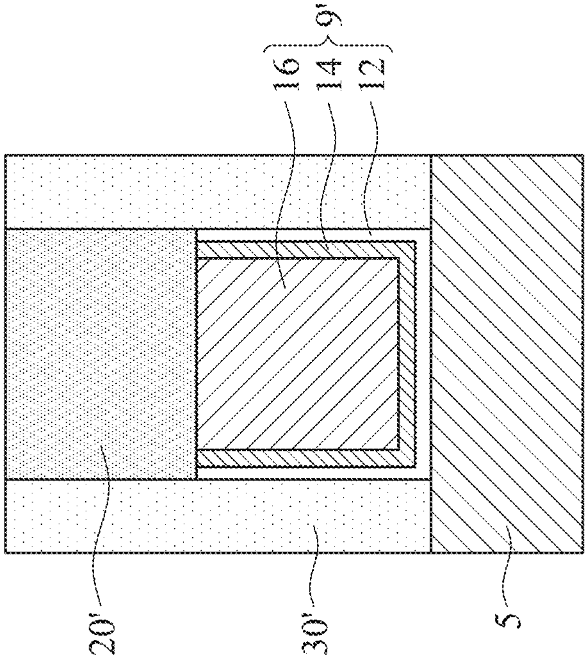

FIG. 6B is an enlarged view of the metal gate structure 10' and the dummy metal gate structure 10. The following description is for the metal gate structure 10' and the dummy metal gate structure 10 has substantially the same structure.

The metal gate structure 10' includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel layer and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20' includes one or more layers of insulating material such as silicon nitride based material including SiN, SiCN and SiOCN. The sidewall spacer 30' is made of a different material than the cap insulating layer 20' and includes one or more layers of insulating material such as silicon nitride based material including SiN, SiON, SiCN and SiOCN. The first ILD layer 60 includes one or more layers of insulating material such as silicon oxide based material such as silicon dioxide ($SiO_2$), SiON, SiCO or SiOCN, or other low-k materials.

The material of the sidewall spacer 30', the material of the cap insulating layer 20', and a material of the first ILD layer 60 are different from each other, so that each of these layers can be selectively etched. In one embodiment, the sidewall spacer 30' is made of SiOCN, SiCN or SiON, the cap insulating layer 20' is made of SiN, and the first ILD 60 layer is made of $SiO_2$.

In this embodiment, fin field effect transistors (Fin FETs) fabricated by a gate-replacement process are employed.

FIG. 6C shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 6C. In FIG. 6C, parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 6C substantially correspond to the metal gate structures 10' (dummy metal gate structures 10), cap insulating layers 20' (dummy cap insulating layers 20), sidewall spacers 30' (dummy sidewall spacers 30), S/D regions 50' (dummy S/D regions 50) and first ILD 60, of FIG. 6A.

Figure 7:
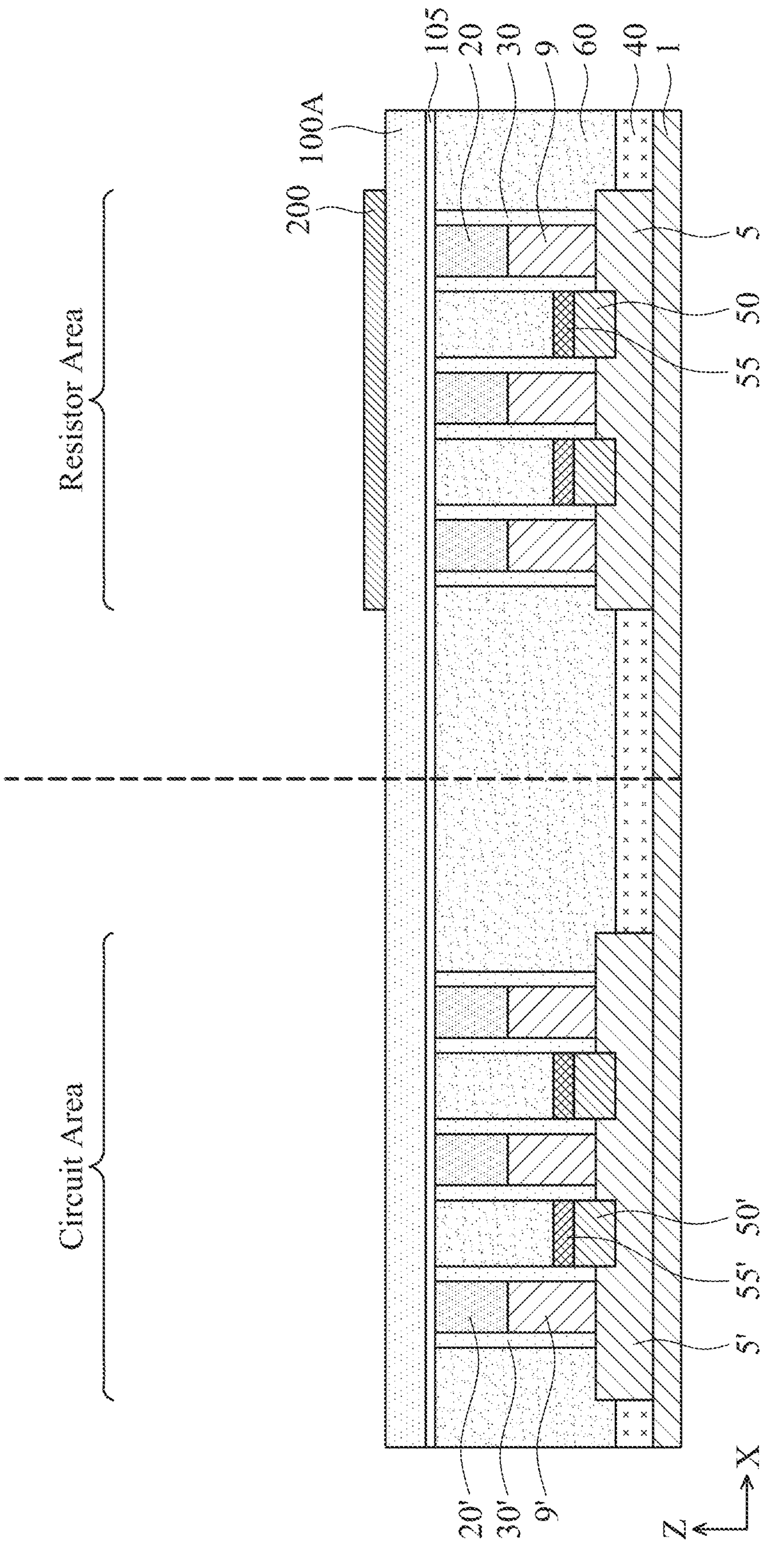

As shown in FIG. 7, a lower portion of a second ILD layer 100A is formed over the first ILD layer 60. In some embodiments, a first insulating layer 105, which functions as a first etch stop layer (ESL) in the subsequent contact hole etching operation, is disposed between the first ILD layer 60 and the lower portion of the second ILD layer 100A.

The first insulating layer 105 includes one or more layers of a silicon nitride based material, such as SiN, SiCN or SiOCN. The second ILD layer 100A includes one or more layers of insulating material such as silicon oxide based material such as silicon dioxide ($SiO_2$), SiON, SiCO or SiOCN, or other low-k materials.

After forming the lower portion of the second ILD layer 100A, a resistor wire 200 is formed on the lower portion of the second ILD layer 100A, as shown in FIG. 7. A blanket layer of a conductive material is formed over the lower portion of the second ILD layer 100A, and a patterning operation is performed so as to obtain the resistor wire 200. The blanket layer may be formed by CVD, physical vapor deposition (PVD) including sputtering or other suitable film formation methods.

Figure 8:
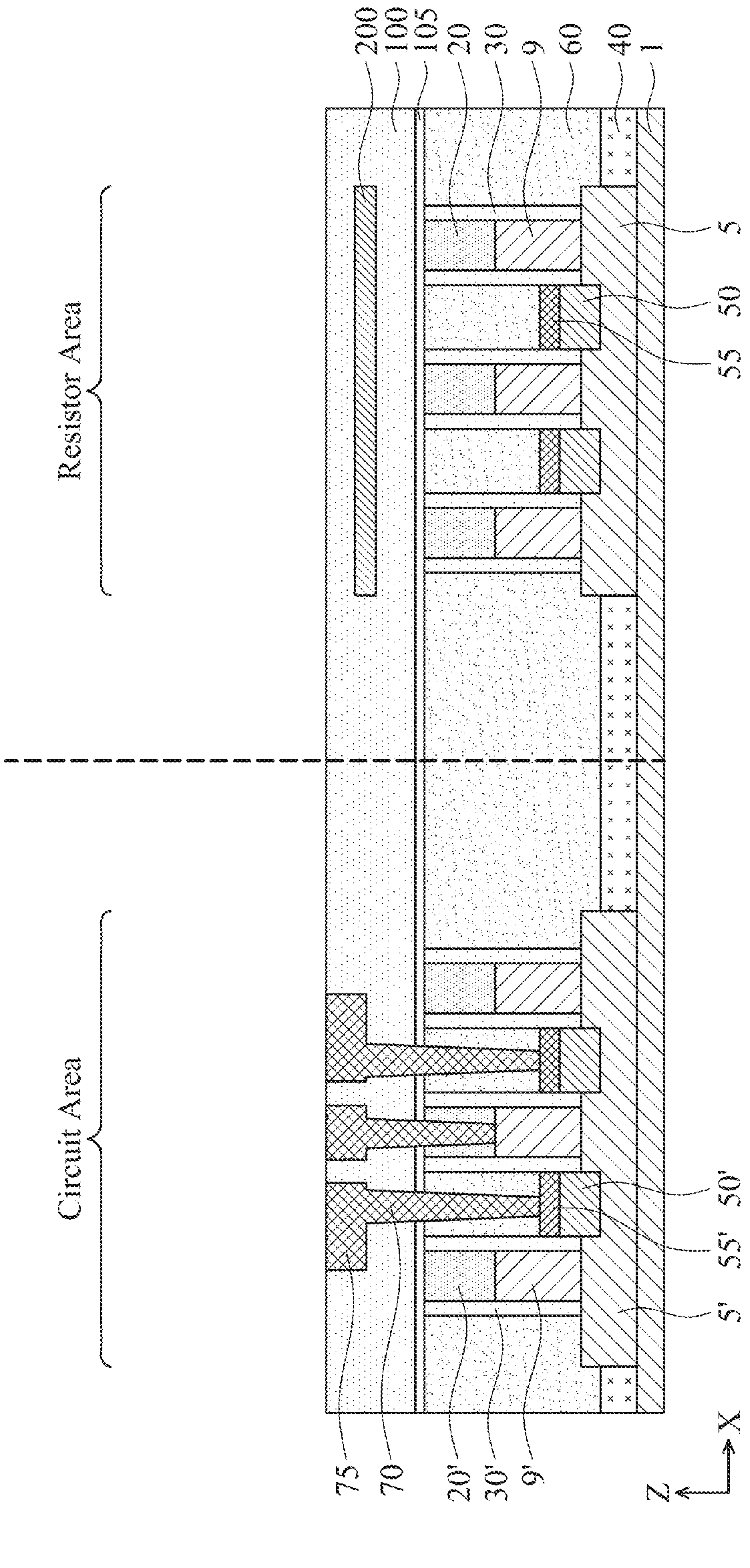

Subsequently, the upper portion of the second ILD layer is formed over the lower portion 100A of the second ILD layer, and the resistor wire 200 is embedded in the second ILD layer 100, as shown in FIG. 8. In some embodiments, in the circuit area, a first contact plug 70 and a first metal wiring 75 are formed by using, for example, a dual damascene process, as shown in FIG. 8. The first contact plug 70 and the first metal wiring 75 include one or more layers of Cu, Al, Ti, Co, W or Ni, or alloys thereof, or TiN or TaN.

Figure 9A:
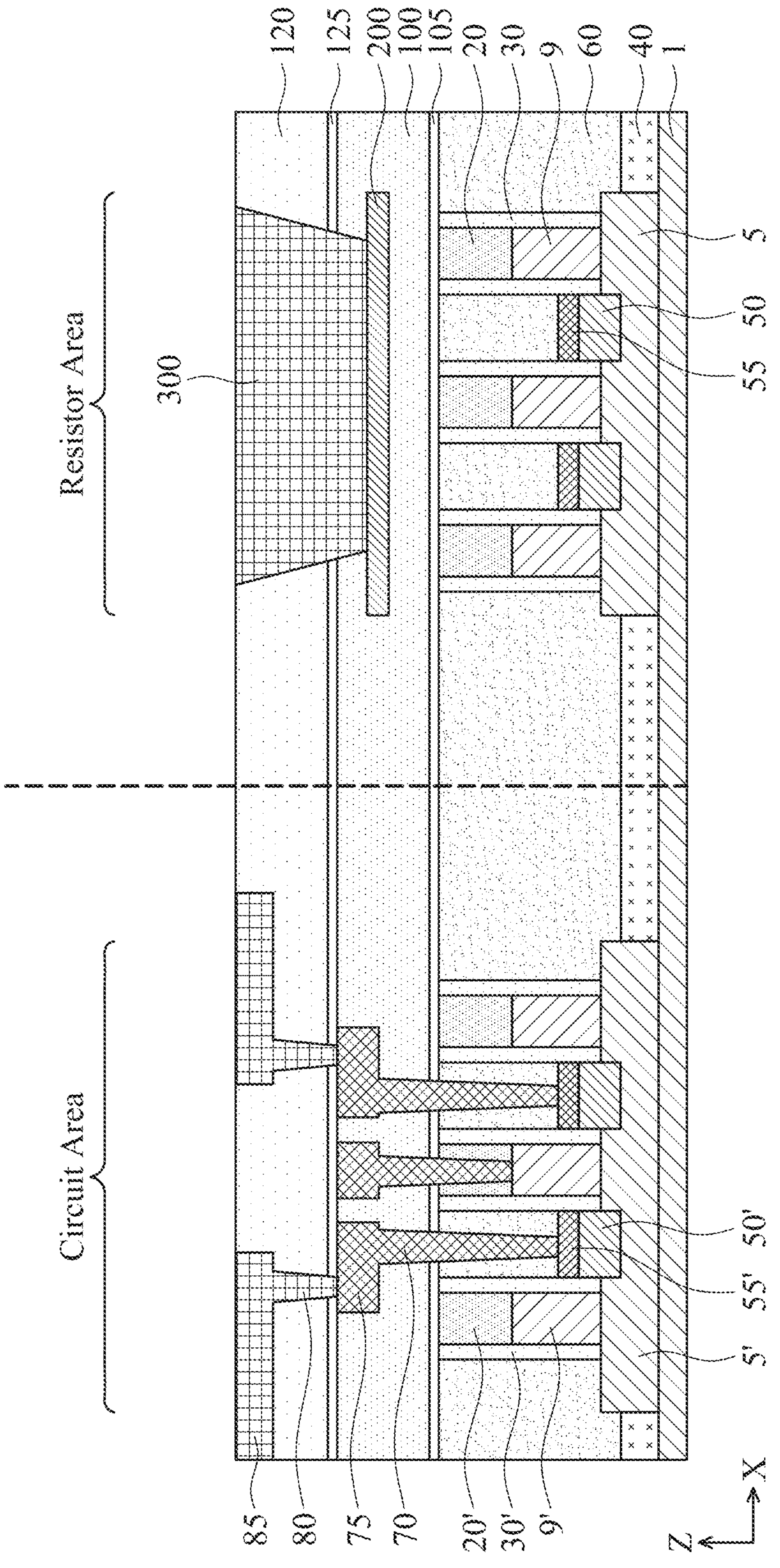

Further, as shown in FIG. 9A, a third ILD layer 120 is formed over the second ILD layer 100. In some embodiments, a second insulating layer 125, which functions as a second ESL in the subsequent contact hole etching operation, is disposed between the second ILD layer 100 and the third ILD layer 120. The materials or configuration of the third ILD layer 120 and the second ESL 125 are similar to those of the second ILD layer 100 and the first ESL 105.

After the third ILD layer 120 is formed, the contact 300 is formed connected to the resistor wire 200, as shown in FIG. 9A.

In some embodiments, in the circuit area, a second contact plug 80 and a second metal wiring 85 are formed by using, for example, a dual or single damascene process, as shown in FIG. 9A. The contact 300 can be formed at the same time as the second contact plug 80 and/or the second metal wiring 85. The materials or configuration of the second contact plug 80 and the second metal wiring 85 are similar to those of the first contact plug 70 and the first metal wiring 75.

Figure 9B:
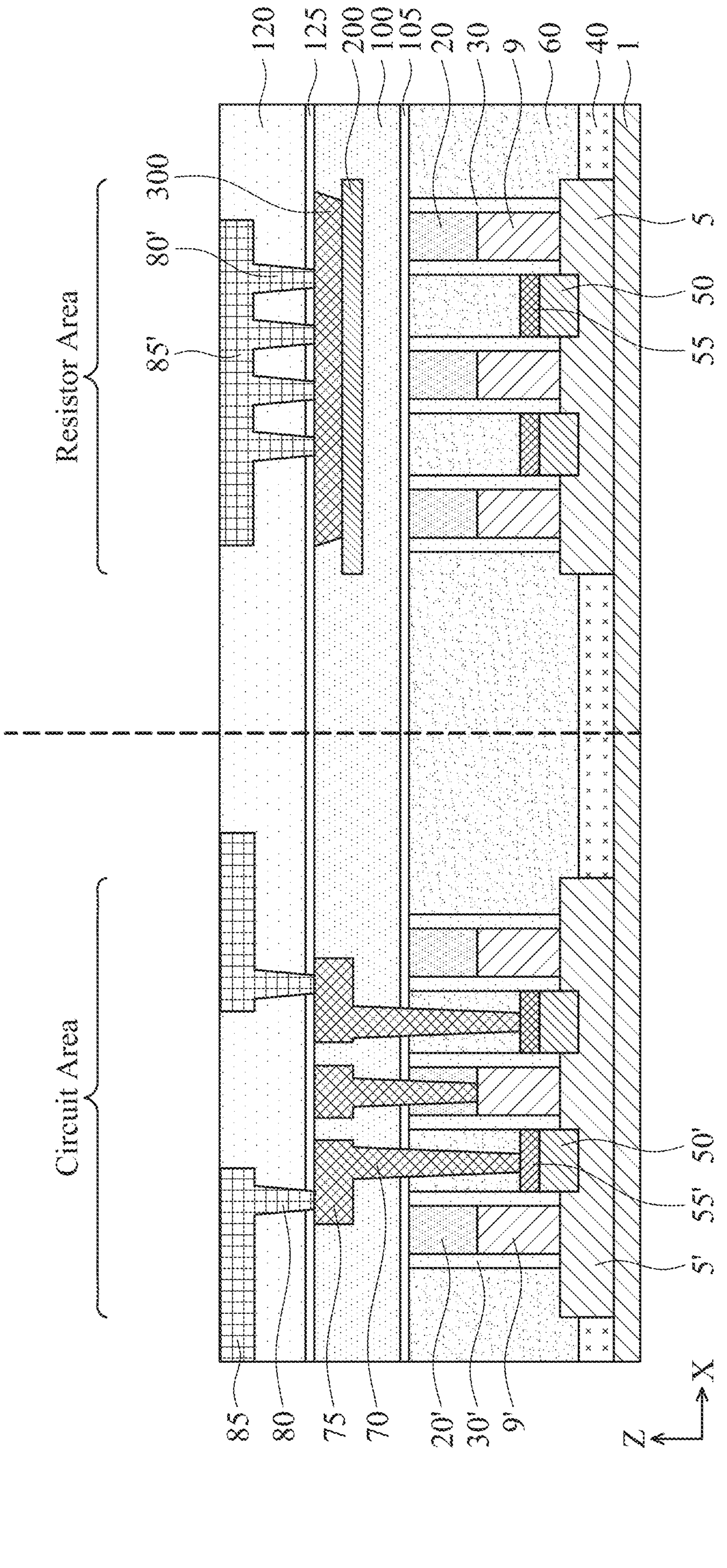
FIG. 9B shows an exemplary cross sectional view of another embodiment of the present disclosure.

FIG. 9B shows another embodiment of the wiring structure. As shown in FIG. 9B, a contact 300 is formed by a wiring level same as the first metal wiring 75 or the first contact plug 70. Then, the contact 300 is further connected to an upper layer wiring 85' through a contact plug 80', which are similar to the second metal wiring 85 and the second contact plug 80.

FIGS. 10-13 show various stages of the sequential fabrication process of a semiconductor device according to another embodiment of the present disclosure. It is understood that additional operations can be provided before, during, and after processes shown by FIGS. 6A-9A, and some of the operations described below can be replaced or eliminated, for additional embodiments of the method. The order of the operations/processes may be interchangeable. Further, the same or similar structures, materials, configurations and/or processes as the foregoing embodiments may be employed in the following embodiment, and the detailed explanation may be omitted.

Figure 10:
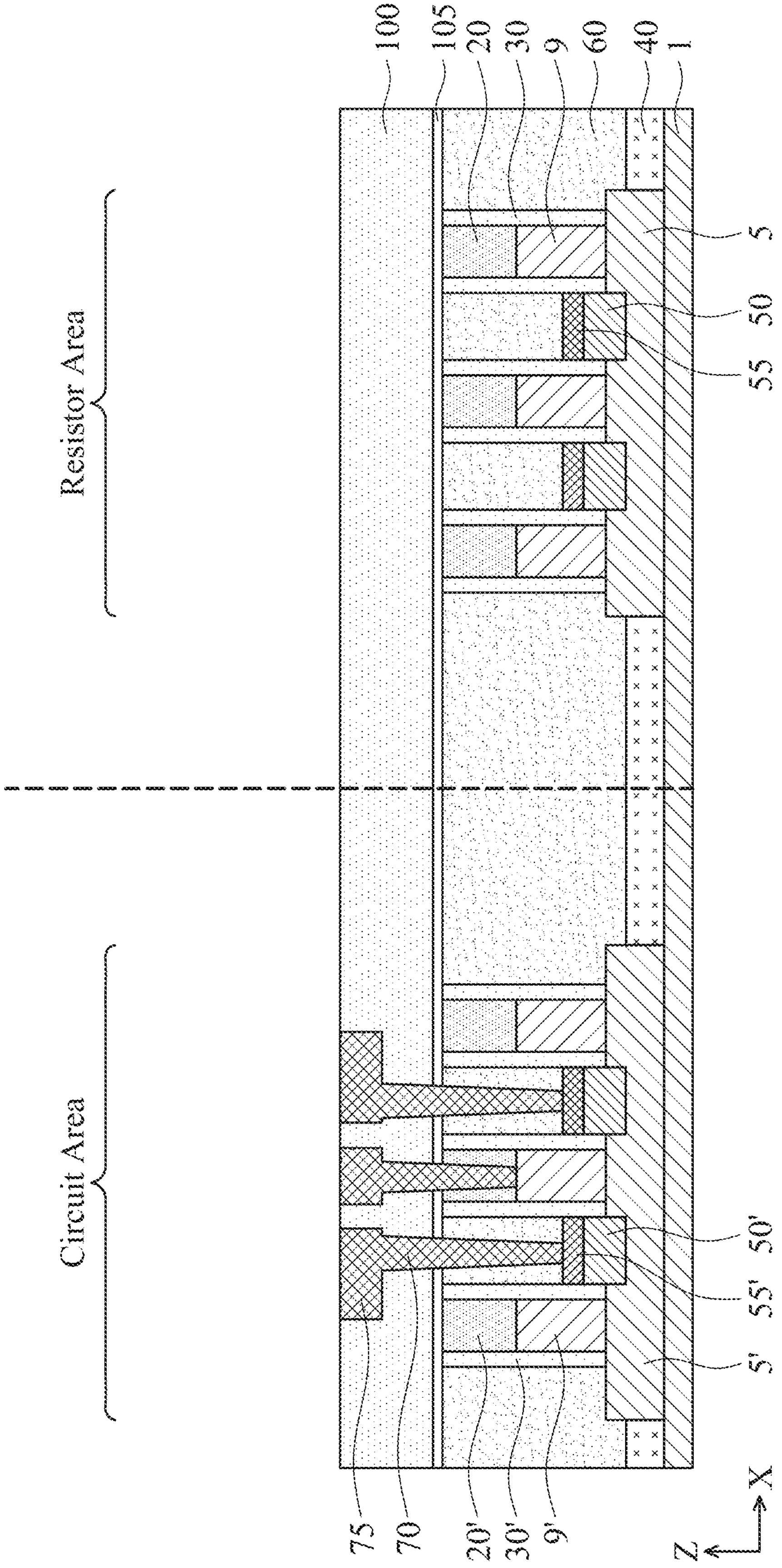
FIGS. 10-13 show various stages of the sequential fabrication process of a semiconductor device according to one embodiment of the present disclosure.

After the structure of FIG. 6 is formed, a second ILD layer 100 and a first ESL 105 are formed over the first ILD layer 60, as shown in FIG. 10. In some embodiments, in the circuit area, a first contact plug 70 and a first metal wiring 75 are formed, as shown in FIG. 10.

Figure 11:
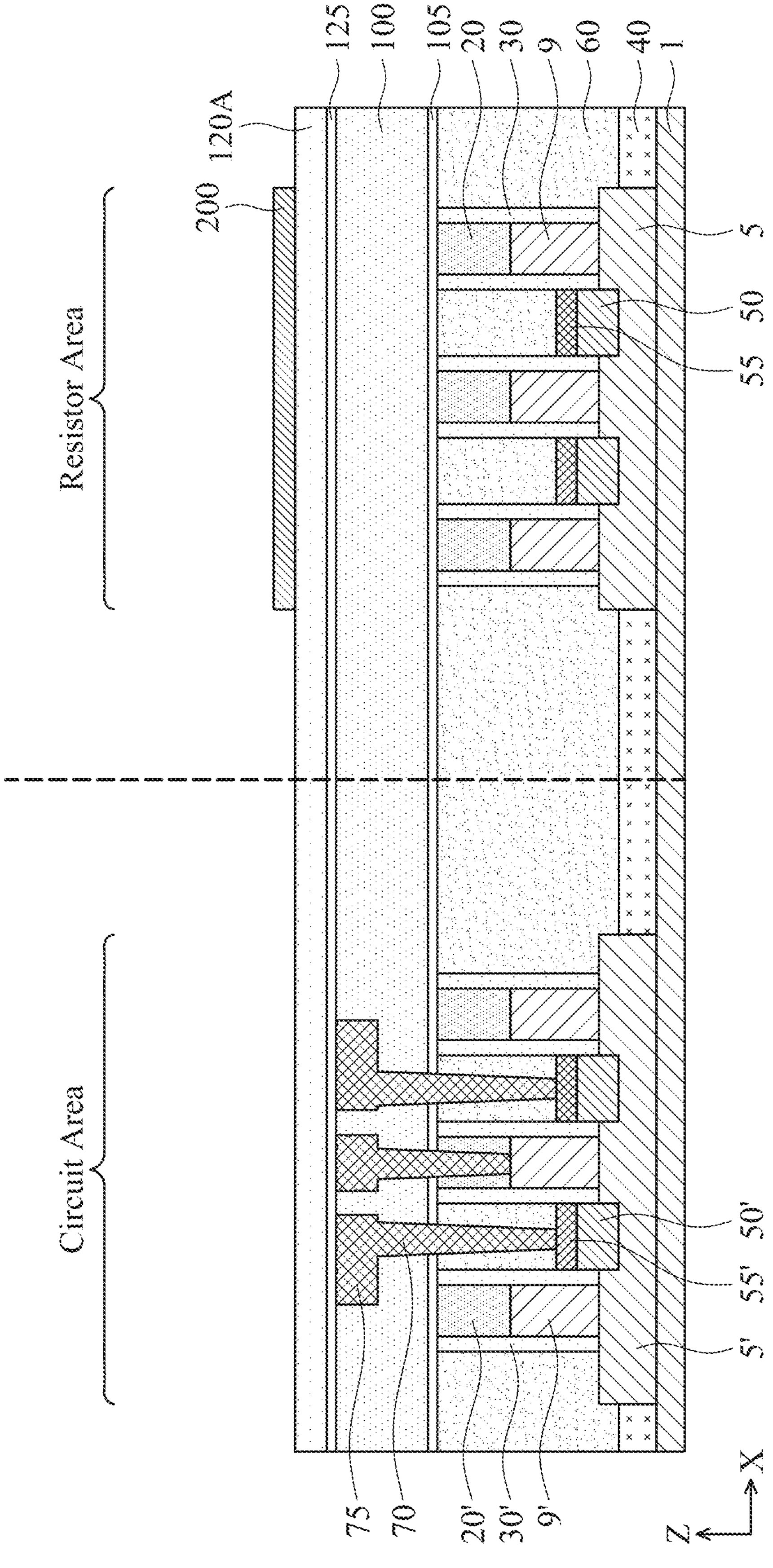

Then, as shown in FIG. 11, a lower portion of a third ILD layer 120A is formed over the second ILD layer 100. In some embodiments, a second insulating layer 125, which functions as a second ESL in the subsequent contact hole etching operation, is disposed between the second ILD layer 100 and the lower portion of the third ILD layer 120A.

After forming the lower portion of the third ILD layer 120A, the resistor wire 200 is formed on the lower portion of the third ILD layer 120A, as shown in FIG. 11.

Figure 12:
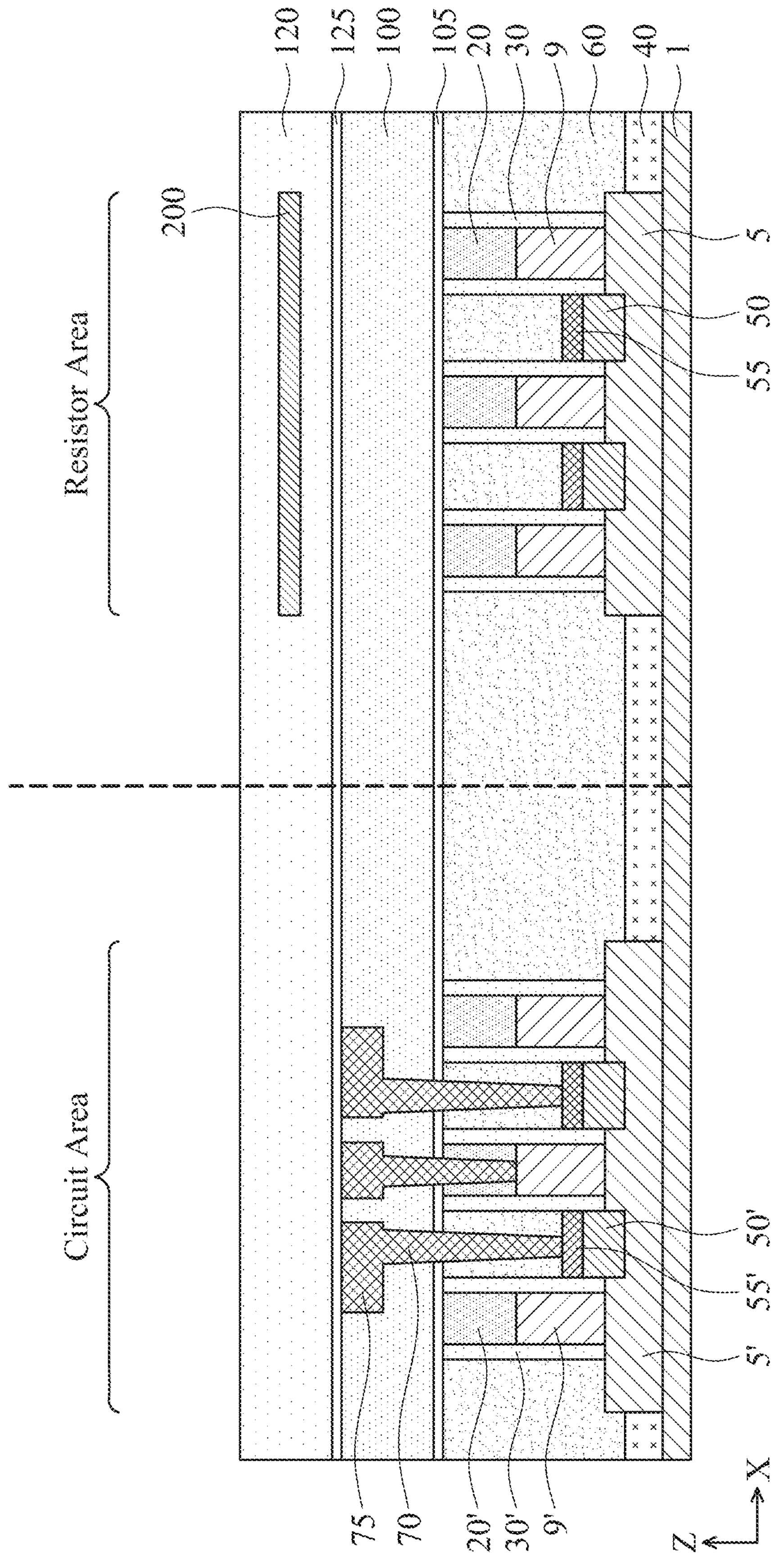

Subsequently, the upper portion of the third ILD layer is formed over the lower portion 120A of the third ILD layer, and the resistor wire 200 is embedded in the third ILD layer 100, as shown in FIG. 12.

Figure 13:
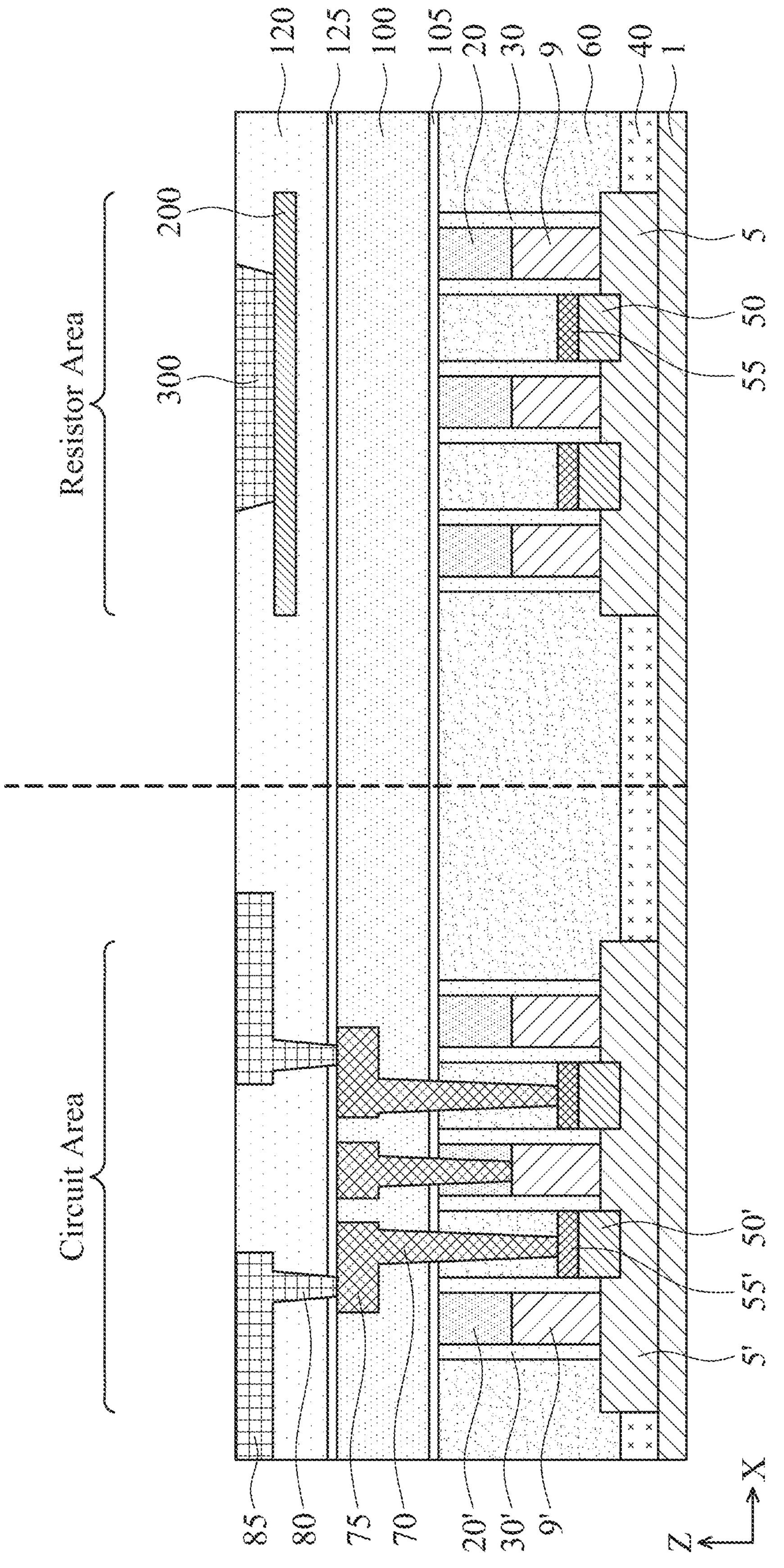

Further, as shown in FIG. 13, a contact 300 is formed in the third ILD layer 120. In some embodiments, in the circuit area, a second contact plug 80 and a second metal wiring 85 are formed by using, for example, a dual damascene process, as shown in FIG. 12. In some embodiments, the contact 300 is formed at the same time as the second contact plug 80 and/or the second metal wiring 85.

Figure 14:
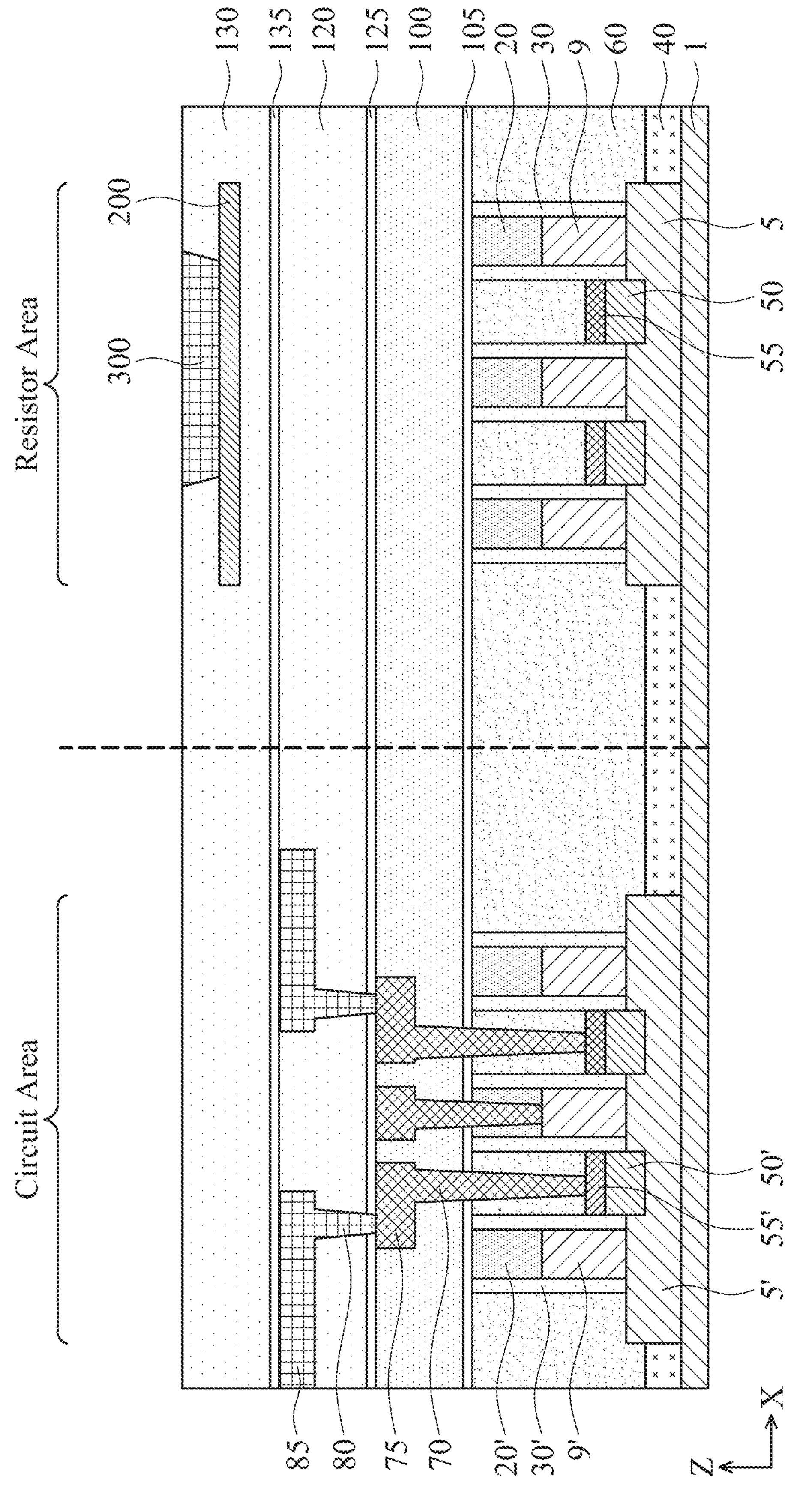
FIG. 14 shows an exemplary cross sectional view of another embodiment of the present disclosure.

FIG. 14 shows an exemplary cross sectional view of another embodiment of the present disclosure. It is understood that additional operations can be provided before, during, and after processes shown by FIG. 14, and some of the operations described below can be replaced or eliminated, for additional embodiments of the method. The order of the operations/processes may be interchangeable. Further, the same or similar structures, materials, configurations and/or processes as the foregoing embodiments may be employed in the following embodiment, and the detailed explanation may be omitted.

As shown in FIG. 14, the resistor wire 200 is embedded in the fourth ILD layer 130.

After the structure of FIG. 10 is formed, a third ILD layer 120 and a second ESL 125 are formed over the second ILD layer 100. After the third ILD layer 120 is formed, in some embodiments, in the circuit area, a second contact plug 80 and a second metal wiring 85 are formed.

Subsequently, by using the similar operations with respect to FIGS. 11-13, the fourth ILD layer 130, the resistor wire 200 and the contact 300 are formed, as shown in FIG. 14.

When one or more ILD layers are further formed below the ILD layer in which the resistor wire 200 is formed, the aforementioned operations are repeated.

It is understood that the devices shown in FIGS. 9A, 9B, 13 and 14 undergo further CMOS processes to form various features such as interconnect metal layers, dielectric layers, passivation layers, etc.

The various embodiments or examples described herein offer several advantages over the existing art. For example, in the present disclosure, by placing all of the dummy fin structures and the dummy gate structures under the resistor wires, it is possible to reduce the area of the resistor area and/or a resistor array. Further, by interposing more than one additional ILD layers between the ILD layer in which the resistor wire is disposed and the ILD layer in which the dummy gate structures are disposed, it is possible to reduce variations of the resistance values.

It will be understood that not all advantages have been necessarily discussed herein, no particular advantage is required for all embodiments or examples, and other embodiments or examples may offer different advantages.

According to one aspect of the present disclosure, a semiconductor device includes a dummy fin structure disposed over a substrate, a dummy gate structure disposed over a part of the dummy fin structure, a first interlayer dielectric layer in which the dummy gate structure is embedded, a second interlayer dielectric layer disposed over the first interlayer dielectric layer, and a resistor wire formed of a conductive material and embedded in the second interlayer dielectric layer. The resistor wire overlaps the dummy gate structure in plan view According to another aspect of the present disclosure, a semiconductor device includes a first dummy fin structure disposed over a substrate, a first dummy gate structure disposed over a part of the first dummy fin structure, a first interlayer dielectric layer in which the first dummy gate structure is embedded, a second interlayer dielectric layer disposed over the first interlayer dielectric layer, a third interlayer dielectric layer disposed over the second interlayer dielectric layer, and a resistor wire formed by a conductive material and embedded in the third interlayer dielectric layer. The resistor wire partially or fully overlaps the first dummy fin structure in plan view.

In accordance with yet another aspect of the present disclosure, in a method of manufacturing a semiconductor device, a first dummy fin structure is formed over a substrate. A first dummy gate structure is formed over a part of the first dummy fin structure. A first interlayer dielectric layer is formed so that the first dummy gate structure is embedded in the first interlayer dielectric layer. A second interlayer dielectric layer is formed over the first interlayer dielectric layer. A third interlayer dielectric layer is formed over the second interlayer dielectric layer. A resistor wire made of a conductive material is formed such that the resistor wire is embedded in the third interlayer dielectric layer. The resistor wire at least partially overlaps the first dummy fin structure in plan view.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a fin disposed over a substrate, wherein the fin extends along a first direction;

a metal gate structure extending in a second direction crossing the first direction disposed over the fin, wherein the metal gate structure has no electrical function or is not part of a functioning circuit;

a first silicon oxide based layer in which the metal gate structure is embedded;

a second silicon oxide based layer disposed over the first silicon oxide based layer; and a metal nitride wire embedded in the second silicon oxide based layer such that the metal nitride wire is separated from the metal gate structure by the second silicon oxide based layer, wherein the metal nitride wire overlaps the metal gate structure in plan view.

2. The semiconductor device of claim 1, further comprising a silicon nitride based layer disposed between the first silicon oxide based layer and the second silicon oxide based layer.

3. The semiconductor device of claim 2, wherein the silicon nitride based layer includes one or more layers of silicon nitride, SiCN, or SiOCN.

4. The semiconductor device of claim 1, wherein the metal nitride wire is made of a transition metal nitride.

5. The semiconductor device of claim 1, further comprising one or more additional silicon oxide based layers disposed between the first silicon oxide based layer and the second silicon oxide based layer.

6. The semiconductor device of claim 5, further comprising a silicon nitride based layer disposed between adjacent silicon oxide based layers.

7. The semiconductor device of claim 1, wherein the first silicon oxide based layer or the second silicon oxide based layer is made of a low-k material.

8. The semiconductor device of claim 1, wherein the first silicon oxide based layer includes one or more layers of $SiO_2$, SiON, SiCO, or SiOCN.

9. The semiconductor device of claim 1, wherein the metal gate structure includes two or more metal gate electrodes extending in the second direction and arranged in the first direction disposed over the fin.

10. The semiconductor device of claim 1, wherein the metal nitride wire extends in the second direction.

11. A semiconductor device, comprising:

a first fin and gate structure and a second fin and gate structure disposed over a substrate, wherein the first and second fin and gate structures have no electrical function or are not part of a functioning circuit;

a first silicon oxide based layer disposed over the first and second fin and gate structures;

a second silicon oxide based layer disposed over the first silicon oxide based layer; and a first metal nitride wire, a second metal nitride wire, first dummy metal nitride wire, and second dummy metal nitride wire embedded in the second silicon oxide based layer, wherein the first metal nitride wire is disposed over the first fin and gate structure, the second metal nitride wire is disposed over the second fin and gate structure, and the first and second dummy metal nitride wires are disposed outside the first and second metal nitride wires in plan view.

12. The semiconductor device of claim 11, further comprising a silicon nitride based layer disposed between the first silicon oxide based layer and the second silicon oxide based layer.

13. The semiconductor device of claim 12, wherein the silicon nitride based layer includes one or more layers of silicon nitride, SiCN, or SiOCN.

14. The semiconductor device of claim 11, wherein the first and second metal nitride wires are made of a transition metal nitride.

15. The semiconductor device of claim 11, further comprising one or more additional silicon oxide based layers disposed between the first silicon oxide based layer and the second silicon oxide based layer.

16. A semiconductor device, comprising:

a first fin and gate structure, a second fin and gate structure, and a third fin and gate structure arranged along a first direction and disposed over a substrate, wherein the first, second, and third fin and gate structures have no electrical function or are not part of a functioning circuit;

a first silicon oxide based layer disposed over the first, second, and third fin and gate structures;

a second silicon oxide based layer disposed over the first silicon oxide based layer; and a first metal nitride wire, a second metal nitride wire, first dummy metal nitride wire, and second dummy metal nitride wire embedded in the second silicon oxide based layer, wherein the first metal nitride wire is disposed between the first and second fin and gate structures in plan view, the second metal nitride wire is disposed between the second and third fin and gate structures in plan view, the first dummy metal nitride wire is disposed outside the first fin and gate structure along the first direction in plan view, and the second dummy metal nitride wire is disposed outside the third fin and gate structure along the first direction in plan view.

17. The semiconductor device of claim 16, further comprising a silicon nitride based layer disposed between the first silicon oxide based layer and the second silicon oxide based layer.

18. The semiconductor device of claim 17, wherein the silicon nitride based layer includes one or more layers of silicon nitride, SiCN, or SiOCN.

19. The semiconductor device of claim 16, wherein the first and second metal nitride wires are made of a transition metal nitride.

20. The semiconductor device of claim 16, further comprising one or more additional silicon oxide based layers disposed between the first silicon oxide based layer and the second silicon oxide based layer.

* * * * *